US007288365B2

(12) United States Patent
Kawamura

(10) Patent No.: US 7,288,365 B2
(45) Date of Patent: Oct. 30, 2007

(54) IMAGE FORMATION PROCESS AND PLANOGRAPHIC PRINTING PLATE MATERIAL

(75) Inventor: Tomonori Kawamura, Hachioji (JP)

(73) Assignee: Konica Minolta Medical & Graphic, Inc. (JP)

( * ) Notice: Subject to any disclaimer, the term of this patent is extended or adjusted under 35 U.S.C. 154(b) by 0 days.

(21) Appl. No.: 11/435,244

(22) Filed: May 15, 2006

(65) Prior Publication Data

US 2006/0263721 A1 Nov. 23, 2006

(30) Foreign Application Priority Data

May 19, 2005 (JP) ............................ 2005-146395

(51) Int. Cl.
*G03F 7/105* (2006.01)
*G03F 7/14* (2006.01)
*G03F 7/40* (2006.01)

(52) U.S. Cl. ................ 430/294; 430/271.1; 430/278.1; 430/302; 430/964

(58) Field of Classification Search ............. 430/270.1, 430/271.1, 281.1, 302, 434, 435, 494, 944, 430/945, 294, 278.1, 964
See application file for complete search history.

(56) References Cited

U.S. PATENT DOCUMENTS

| | | | | |
|---|---|---|---|---|
| 5,103,730 | A * | 4/1992 | Sarda | 101/425 |
| 6,107,001 | A * | 8/2000 | Lewis et al. | 430/302 |
| 6,110,644 | A * | 8/2000 | Vermeersch et al. | 430/302 |
| 6,140,005 | A * | 10/2000 | Van Damme et al. | 430/156 |

FOREIGN PATENT DOCUMENTS

| | | |
|---|---|---|
| JP | 7-333831 | 12/1995 |
| JP | 11-240270 | 9/1999 |
| JP | 2000-225780 | 8/2000 |
| JP | 2002-205466 | 7/2002 |
| JP | 2002-211150 | 7/2002 |

* cited by examiner

*Primary Examiner*—Richard L. Schilling
(74) *Attorney, Agent, or Firm*—Cantor Colburn LLP

(57) ABSTRACT

Disclosed is an image forming method possessing the steps of producing a planographic printing plate via a development treatment of exposing a hydrophilic surface of an aluminum support by removing a thermosensitive image formation layer provided on the hydrophilic surface, that is not imagewise heated on a printing press, after imagewise heating a planographic printing plate material having the thermosensitive image formation layer provided on the hydrophilic surface of the aluminum support, and of treating the planographic printing plate with an ink cleaning agent after printing, wherein the hydrophilic surface is colored by a colorant having a solubility of 5-100 g, based on 1 liter of n-decane, and the colorant on the hydrophilic surface exposed after removing the thermosensitive image formation layer is removed in the above step of treating the planographic printing plate with an ink cleaning agent.

8 Claims, No Drawings

IMAGE FORMATION PROCESS AND PLANOGRAPHIC PRINTING PLATE MATERIAL

This application claims priority from Japanese Patent Application No. 2005-146395 filed on May 19, 2005, which is incorporated hereinto by reference.

TECHNICAL FIELD

The present invention relates to am image formation process and a planographic printing plate material employing a planographic printing plate material capable of forming an image according to a computer to plate (CTP) system, and particularly to a development-on-press planographic printing plate material and an image formation process employing the development-on-press planographic printing plate material.

BACKGROUND

Presently, printing employing a CTP system has been conducted in printing industries, accompanied with the digitization of printing data. A printing plate material for CTP, which is inexpensive, can be easily handled, and has printability comparable with that of a PS plate, is desired.

Particularly in recent years, a printing plate material has been sought which does not require any development employing a developer containing specific chemicals (such as alkalis, acids, and solvents), and can be applied to a conventional printing press. Known are a chemical-free type printing plate material such as a phase change type printing plate material requiring no development process, a printing plate material which can be processed with water or a neutral processing liquid comprised mainly of water, or a printing plate material capable of being developed on a printing press at initial printing stage and requiring no development process; and a printing plate material called a processless printing plate material.

A printing plate material requiring no development process or a processless printing plate material to be developed on a plate cylinder of a printing press is required to provide an exposure visualization property similarly to a conventional PS, since it is punched after imagewise exposure to form holes for mounting on the plate cylinder. After mounting a printing plate on the press, and operating a printing process, the resulting scratches and stain are desired to be removed or corrected. In this case, a printing image capable of visibility is desired to be formed in order to visually identify corrected portions. This is referred to as a printing visualization property.

A processless printing plate material is imagewise exposed employing an infrared laser with an emission wavelength of from near-infrared to infrared regions to form an image. The thermal processless printing plate material employing this method is divided into three types: an ablation type printing plate material, a development-on-press type printing plate material with a heat melt image formation layer, and a phase change type printing plate material, each described later.

Known is the following printing plate material such as a processless printing plate material having an exposure visualization property and a printing visualization property.

Examples of commonly known printing plate materials include a printing plate material having a layer containing a thermo-sensitively coloring material such as a leuco dye and a color developing agent in an image formation layer or a lipophilic oil layer containing a compound colored by a functional polymeric compound generating a sulfonic acid or a generated acid via heating (refer to Patent Documents 1 and 2), a printing plate material having a layer containing an IR-dye capable of varying optical density by exposing image formation elements (refer to Patent Document 3), and a printing plate material having a hydrophilic overcoat layer removable on a printing press, which contains at least 20% by weight of a cyanine infrared absorbing dye capable of varying optical density by light exposure (refer to Patent Document 4).

Also known is a light sensitive planographic printing plate material in which small dot reproduction, dot reproduction, and development visibility are improved by dyeing the surface of an aluminum support with a dye (refer to Patent Document 5).

However, it is seen as a problem that dyes are sublimed or scattered via laser exposure during image formation since these printing plate materials contain these dyes resulting in coloring, discoloring, or color-fading in an image formation layer via light exposure. There is also a problem such that it is difficult to avoid contamination to printing ink as well as dampening water, caused by these dyes, and a large amount of paper waste is consumed to the point where a normal printing paper sheet is obtained during development-on-press, whereby an insufficient printing visualization property results.

Since a light-to-heat conversion material and a coloring or discoloring material are dispersed in constituting layers of these printing plate materials, insufficient sensitivity and on-press developability of a printing plate material are also exhibited in the case of acquiring sufficient exposure visualization, resulting in difficulty in balancing printing suitability with exposure visualization.

(Patent Document 1) Japanese Patent O.P.I. Publication No. 2000-225780

(Patent Document 2) Japanese Patent O.P.I. Publication No. 2002-211150

(Patent Document 3) Japanese Patent O.P.I. Publication No. 11-240270

(Patent Document 4) Japanese Patent O.P.I. Publication No. 2002-205466

(Patent Document 5) Japanese Patent O.P.I. Publication No. 7-333831

SUMMARY

It is an object of the present invention to provide a planographic printing plate material and an image forming method exhibiting excellent printing visualization property and anti-stain property, and Specifically to provide the planographic printing plate material and the image forming method exhibiting not only an excellent exposure visualization property as well as an excellent printing visualization property, but also an excellent on-press developability, accompanied with an anti-stain property. Also disclosed is an image forming method possessing the steps of producing a planographic printing plate via a development treatment of exposing a hydrophilic surface of an aluminum support by removing a thermosensitive image formation layer provided on the hydrophilic surface, that is not imagewise heated on a printing press, after imagewise heating a planographic printing plate material having the thermosensitive image formation layer provided on the hydrophilic surface of the aluminum support, and of treating the planographic printing plate with an ink cleaning agent after printing, wherein the hydrophilic surface is colored by a colorant having a solubility of 5-100 g, based on 1 liter of n-decane, and the colorant on the hydrophilic surface exposed after removing the thermosensitive image formation layer is removed in the latter step of treating the planographic printing plate with an ink cleaning agent after printing.

DESCRIPTION OF THE PREFERRED EMBODIMENTS

The above object of the present invention is accomplished by the following structures.

(Structure 1) An image forming method possessing the steps of: (a) conducting a development treatment of exposing a hydrophilic surface of an aluminum support by removing a thermosensitive image formation layer provided on the hydrophilic surface, that is not imagewise heated on a printing press to produce a planographic printing plate, after imagewise heating a planographic printing plate material having the thermosensitive image formation layer provided on the hydrophilic surface of the aluminum support, (b) applying ink to the planographic printing plate to conduct printing employing the inked plano graphic printing plate, and (c) treating the planographic printing plate with an ink cleaning agent after printing to remove the ink, wherein the hydrophilic surface is colored by a colorant having a solubility of 5-100 g, based on 1 liter of n-decane, and not only the ink is removed, but also the colorant on the hydrophilic surface exposed via removal of the thermosensitive image formation layer is further removed at the same time in step (b).

(Structure 2) The planographic printing plate material employed for the image forming method of Structure 1, wherein the thermosensitive image formation layer is provided on the hydrophilic surface of the aluminum support, and the hydrophilic surface is colored by a colorant having a solubility of 5-100 g, based on 1 liter of n-decane.

(Structure 3) The planographic printing plate material of Structure 2, wherein the thermosensitive image formation layer contains a water-soluble resin or a water-dispersible resin.

(Structure 4) The planographic printing plate material of Structure 2 or 3, wherein the colorant has a solubility of 0-0.5 g, based on 1 liter of water at 25° C.

(Structure 5) The planographic printing plate material of any one of Structures 2-4, wherein the thermosensitive image formation layer is an image formation layer capable of varying transparency via imagewise heating.

While the preferred embodiments of the present invention have been described using specific terms, such description is for illustrative purposes only, and it is to be understood that changes and variations may be made without departing from the spirit or scope of the appended claims.

DETAILED DESCRIPTION OF THE INVENTION

It is a feature of the present invention to provide an image forming method possessing the steps of producing a planographic printing plate via a development treatment of exposing a hydrophilic surface of an aluminum support by removing a thermosensitive image formation layer provided on the hydrophilic surface, that is not imagewise heated on a printing press, after imagewise heating a planographic printing plate material having the thermosensitive image formation layer provided on the hydrophilic surface of the aluminum support, and of treating the planographic printing plate with an ink cleaning agent after printing, wherein the hydrophilic surface is colored by a colorant having a solubility of 5-100 g, based on 1 liter of n-decane, and the colorant on the hydrophilic surface exposed after removing the thermosensitive image formation layer is removed in the above step of treating the planographic printing plate with an ink cleaning agent.

In the present invention, a planographic printing plate material exhibiting excellent printing visualization property and development-on-press accompanied with less stain generation can be provided by coloring the hydrophilic surface of a support employing a specific colorant.

Next, the present invention will be described in detail.

[Aluminum Support]

The hydrophilic surface of the present invention is a surface capable of water retention accompanied with ink repellency during printing, existing at non-image portions in which a thermosensitive image formation layer is removed via development-on-press.

An aluminum support having the hydrophilic surface of the present invention can be obtained by making the aluminum substrate surface to be hydrophilic via surface roughening treatment.

The aluminum substrate is an aluminum plate or an aluminum alloy plate. As the aluminum alloy, there can be used various ones including an alloy of aluminum and a metal such as silicon, copper, manganese, magnesium, chromium, zinc, lead, bismuth, nickel, titanium, sodium or iron.

It is preferable that the aluminum plate is subjected to degreasing treatment for removing rolling oil prior to surface roughening. The degreasing treatments include degreasing treatment employing solvents such as trichlene and thinner, and an emulsion degreasing treatment employing an emulsion such as kerosene or triethanol. It is also possible to use an aqueous alkali solution such as an aqueous solution of sodium hydroxide, potassium hydroxide, sodium carbonate, or sodium phosphate for the degreasing treatment. When such an aqueous alkali solution is used for the degreasing treatment, it is possible to remove stain and an oxidized film which can not be removed by the above-mentioned degreasing treatment alone.

When the aqueous alkali solution is used for the degreasing treatment, the resulting plate is preferably subjected to neutralization treatment in an aqueous solution of an acid such as phosphoric acid, nitric acid, sulfuric acid, chromic acid or an mixed acid thereof. The electrolytic surface roughening after the neutralization is carried out preferably in the same acid solution as in the neutralization treatment.

The electrolytic surface roughening treatment of the aluminum plate is carried out according to a known method, but prior to that, chemical surface roughening treatment and/or mechanical surface roughening treatment may be carried out. The mechanical surface roughening treatment is preferably carried out.

The chemical surface roughening treatment is carried out employing an aqueous alkali solution such as an aqueous solution of sodium hydroxide, potassium hydroxide, sodium carbonate, or sodium phosphate in the same manner as in degreasing treatment above. After that, the resulting plate is preferably subjected to neutralization treatment in an aqueous solution of an acid such as phosphoric acid, nitric acid, sulfuric acid, chromic acid or a mixed acid thereof. The electrolytic surface roughening after the neutralization is carried out preferably in the same acid solution as in the neutralization treatment.

Though there is no restriction for the mechanical surface roughening method, a brushing roughening method and a honing roughening method are preferable.

After the plate has been roughened mechanically, it is preferably dipped in an acid or an aqueous alkali solution in order to remove abrasives and aluminum dust, etc. which have been embedded in the surface of the support or to control the shape of pits formed on the plate surface, whereby the surface is etched. Examples of the acid include sulfuric acid, persulfuric acid, hydrofluoric acid, phosphoric acid, nitric acid and hydrochloric acid, and examples of the alkali include sodium hydroxide and potassium hydroxide.

In the present invention, the aluminum plate was mechanically surface roughened with an abrasive with a particle size of not less than #400, followed by etching treatment employing an aqueous alkali solution, whereby a complex surface structure formed due to the mechanical surface roughening treatment can be changed to a surface having a smooth convexoconcave structure. The resulting aluminum plate has a waviness of a relatively long wavelength of several microns to scores microns. The resulting aluminum plate further being subjected to electrolytic surface roughening treatment described later, an aluminum support is obtained which provides a good printing performance and good printing durability. Further, the aluminum plate can reduce a quantity of electricity during the electrolytic surface roughening treatment, contributing to cost reduction.

The resulting plate after dipped in the aqueous alkali solution is preferably subjected to neutralization treatment in an aqueous solution of an acid such as phosphoric acid, nitric acid, sulfuric acid, chromic acid or the mixed acid thereof.

The electrolytic surface roughening after the neutralization is preferably carried out in the same acid solution as in the neutralization treatment.

The electrolytic surface roughening treatment in the present invention is carried out in an acidic electrolytic solution employing an alternating current. As the acidic electrolytic solution, an acidic electrolytic solution used in a conventional electrolytic surface roughening treatment can be used, but a hydrochloric acid or nitric acid electrolytic solution is preferably used. In the present invention, a hydrochloric acid electrolytic solution is especially preferably used.

As a current waveform used in the electrolytic surface roughening treatment, various waveforms such as a rectangular wave, trapezoidal wave, sawtooth wave or sine wave can be used, but sine wave is preferably used.

Separated electrolytic surface roughening treatments disclosed in Japanese Patent O.P.I. Publication No. 10-869 are also preferably used.

In the electrolytic surface roughening treatment carried out using an electrolytic solution of nitric acid, voltage applied is preferably 1-50 V, and more preferably 5-30 V. The current density (in terms of peak value) used is preferably 10-200 A/$dm^2$, and more preferably 20-150 A/$dm^2$.

The total quantity of electricity is preferably 100-2000 C/$dm^2$, more preferably 200-1500 C/$dm^2$, and most preferably 200-1000 C/$dm^2$.

Temperature during the electrolytic surface roughening treatment is preferably 10-50° C., and more preferably 15-45° C. The nitric acid concentration in the electrolytic solution is preferably 0.1-5% by weight.

It is possible to optionally add, into the electrolytic solution, nitrates, chlorides, amines, aldehydes, phosphoric acid, chromic acid, boric acid, acetic acid or oxalic acid.

The electrolytically surface roughened plate is dipped and subjected to etching treatment in an aqueous alkali solution in order to remove smuts produced on the plate surface, or to control the shape of pits formed on the plate surface, whereby the surface is etched.

Examples of the alkali solution include a sodium hydroxide solution, a potassium hydroxide solution, a sodium carbonate solution, or a sodium phosphate solution.

This etching treatment improves initial printability and anti-stain property of a printing plate material comprising an image formation layer.

The resulting plate after dipped in the aqueous alkali solution in the above is preferably subjected to neutralization treatment in an aqueous solution of an acid such as phosphoric acid, nitric acid, sulfuric acid, chromic acid, or the mixed acid thereof. The anodization treatment after the neutralization treatment is carried out preferably in the same acid solution as in the neutralization treatment.

The aluminum plate has been subjected to each of the surface treatments described above, followed by anodization treatment.

There is no restriction in particular for the method of anodization treatment used in the present invention, and known methods can be used. The anodization treatment forms an anodization film on the surface of the aluminum plate. For the anodization treatment in the present invention there is preferably used a method of carrying out electrolysis by applying a current density of 1-10 A/$dm^2$ to an aqueous solution containing sulfuric acid and/or phosphoric acid in a concentration of 10-50%, as an electrolytic solution. However, it is also possible to use a method of carrying out electrolysis by applying a high current density to sulfuric acid as described in U.S. Pat. No. 1,412,768, or a method of carrying out electrolysis in phosphoric acid as described in U.S. Pat. No. 3,511,661.

The aluminum plate, which has been subjected to anodization treatment, is optionally subjected to sealing treatment. For the sealing treatment, it is possible to use known sealing treatment carried out using hot water, boiling water, steam, an aqueous dichromate solution, a nitrite solution and an ammonium acetate solution.

The aluminum plate subjected to anodization treatment may be subjected to surface treatment other than the sealing treatment. Examples of the surface treatment include known treatments such as silicate treatment, phosphate treatment, various organic acid treatment, PVPA treatment and boehmite treatment. Further, the aluminum plate subjected to anodization treatment may be subjected to surface treatment disclosed in Japanese Patent O.P.I. Publication No. 8-314157 in which the aluminum plate is treated in an aqueous bicarbonate solution or the aluminum plate is treated in an aqueous bicarbonate solution, followed by treatment in an organic acid solution such as an aqueous citric acid solution.

(Coloring of Hydrophilic Surface)

The hydrophilic surface of a planographic printing plate material of the present invention is colored employing the after-mentioned colorant.

Coloring by this colorant is carried out prior to or after hydrophilicity treatment of the foregoing aluminum support.

The coloring of the hydrophilic surface is carried out by conducting a drying process after dipping in or coating the liquid in which a colorant is dissolved generally in the concentration range of 0.01-10% by weight in an organic solvent including alcohol such as ethanol or isopropanolbutanol; a ketone solvent such as methylethyl ketone, methylisobutyl ketone or cyclohexane; an aromatic solvent such as toluene, xylene or benzene; or an ester solvent such as ethyl acetate or butyl acetate.

(Colorant)

A colorant to color the hydrophilic surface in view of a printing visualization property as well as an anti-stain property of printing ink is required to have a solubility of 5-100 g, based on 1 liter of n-decane at 25° C.

It is preferable that a colorant of the present invention has a solubility of 0-0.5 g, based on 1 liter of water at 25° C., and also more preferable that the colorant has a solubility of 0.5 g, based on 1 liter of water at 25° C., in view of occurrence prevention of lowered density and color unevenness of the image formation layer, exposure visualization, and prevention of contaminations adhering to the interior of a printing press or printed paper sheets, caused by colorants.

The following dyes can be provided as colorants.

Examples of dyes include a cyanine dye, a phthalocyanine dye, a polymethine dye, and others such as those including naphthoquinone type dyes, anthraquinone type dyes and azomethine type dyes described in Japanese Patent O.P.I. Publication Nos. 59-78896, 59-227948, 60-24966, 60-53563, 60-130735, 60-131292, 60-239289, 61-19396, 61-22993, 61-31292, 61-31467, 61-35994, 61-49893, 61-148269, 62-191191, 63-91288, 63-91287 and 63-290793; anthraquinone type dyes, azo type dyes and azomethine type dyes described in Japanese Patent O.P.I. Publication Nos. 59-78896, 60-30392, 60-30394, 60-253595, 61-262190, 63-5992, 63-205288, 64-159 and 64-63194; and methine type dyes, azo type dyes, quinophthalone type dyes, anthraisothiazole type dyes and indoaniline dyes described in Japanese Patent O.P.I. Publication Nos. 59-78896, 60-27594, 60-31560, 60-53565, 61-12394 and 63-122594. Of these, dyes can be used without special limitations, as long as the above-described solubility is satisfied.

(Thermosensitive Image Formation Layer)

A thermosensitive image formation layer of the present invention (hereinafter, referred to also as image formation layer) is a layer capable of forming images via imagewise heating as well as of developing on a printing press.

In order to conduct imagewise heating, there is an image wise heating method employing a heat source directly, or a heating method via heat generated by laser light exposure. In the present invention, the image exposure method employing laser light is preferably used.

"Capable of developing on a printing press" means that the image formation layer at non-image portions is removed by dampening water or printing ink during planographic printing after exposure.

Heated portions in the image formation layer become ink receptive image portions during printing.

The image formation layer contains a thermosensitive material resulting in deformation, melting, and softening via heating.

It is preferable that a light-to-heat conversion material is contained in the image formation layer.

Examples of the thermosensitive material include natural or synthetic wax, polyester, polystyrene, polyacryl, a polyurethane based resin and these copolymer resins, or a thermally reactive material such as blockisocyanate or such.

It is preferable that in view of printing durability and development-on-press, the thermosensitive material is blockisocyanate, a urethane resin, or polyester resin particles It is preferred that these resins exhibit a melting point, softening point, and a glass transition point (Tg) of at least 40° C.

It is preferable that a thermosensitive image formation layer of the present invention is an image formation layer capable of varying transparency via imagewise heating in view of an exposure visualization property. The above thermosensitive material is desired to be contained in the form of particles to vary transparency.

Thermoplastic resin particles are also preferred as a thermosensitive material, and the average particle diameter is preferably 0.01-2 μm in view of development-on-press, resolution, and exposure visualization, or more preferably 0.1-1 μm.

In the region where the thermosensitive image formation layer is heated via imagewise heating, a binding force is generated between materials in the image formation layer and also between the hydrophilic surface and the image formation layer to hold printing ink during a printing process.

Since the binding force on the hydrophilic surface is weak in the region where the thermosensitive image formation layer is not heated, the hydrophilic surface is exposed via a removal process during printing. As a result, dampening water remains in this region during printing, resulting in non-image portions.

[Containable Other Materials in Thermosensitive Image Formation Layer]

It is preferable that the following materials are contained in the thermosensitive image formation layer of the present invention.

It is preferable that the thermosensitive image formation layer contains a water-soluble resin or a water-dispersible resin.

Examples of the water-soluble resin or the water-dispersible resin include resins containing an acidic group such as a carboxylic acid or so forth, or a hydrophilic group such as an OH group, an amine group, an acid amide group, a halogen group or a group having ether bond such as polyethylene oxide or such. The following resins are exemplified.

Examples of the foregoing resin include polysaccharide, polyethylene oxide, polypropylene oxide, polyvinyl alcohol, polyethylene glycol (PEG), polyvinyl ether, polyacrylic acid, polyacrylate, polyacrylamide, and polyvinyl pyrrolidone.

Examples of the polysaccharide include starches, celluloses, a polyuronic acid, pullulan and chitosan, a methyl cellulose salt, a carboxymethyl cellulose salt, or a hydroxyethyl cellulose salt.

Of these, an OH group-containing resin is preferably employed as a water-soluble resin usable in the present invention. Specific examples include saccharide (oligosaccharide, polysaccharide, and polysaccharide derivatives) and polyvinyl alcohol.

Cellulose derivatives are particularly preferable as the saccharide. Specifically, preferable examples of cellulose derivatives include hydroxypropyl cellulose, methylhydroxypropyl cellulose, and carboxymethyl cellulose sodium.

The present invention is largely effective particularly when the thermosensitive image formation layer contains each of these water-soluble resins or water-dispersible resins.

In this case, the content of the water-soluble resin or water-dispersible resin is preferably 1-50% by weight, based on the thermosensitive image formation layer, and more preferably 5-30% by weight.

A coating amount of the thermosensitive image formation layer is preferably 0.01-10 g/$m^2$, more preferably 0.1-3 g/$m^2$, and most preferably 0.2-2 g/$m^2$.

(Protective Layer)

A protective layer may be provided on a thermosensitive image formation layer of the present invention.

The following hydrophilic organic resin, saccharide, and such are provided as components contained in the protective layer.

Examples of the hydrophilic organic resin include polyethylene oxide, polypropylene oxide, polyvinyl alcohol, polyethylene glycol (PEG), polyvinyl ether, a styrene-butadiene copolymer, a conjugation diene polymer latex of methyl methacrylate-butadiene copolymer, an acryl polymer latex, a vinyl polymer latex, polyacrylamide, and polyvinyl pyrrolidone.

A cationic resin may also be contained in the hydrophilic layer. Examples of the cationic resin include a polyalkylene-polyamine such as a polyethyleneamine or polypropylene-polyamine or its derivative, an acryl resin having a tertiary amino group or a quaternary ammonium group and diacrylamine. The cationic resin may be added in a form of particles. Examples of such particles include the cationic microgel described in Japanese Patent O.P.I. Publication No. 6-161101.

Though oligosaccharide can be employed as saccharide, polysaccharide is preferably used.

Examples of the usable saccharide include starches, celluloses, a polyuronic acid, pullulan, and others, but cellulose derivatives such as a methylcellulose salt, a carboxymethylcellulose salt and a hydroxyethylcellulose salt are preferably used, and a sodium salt or an ammonium salt of carboxymethylcellulose is more preferably used.

The hydrophilic overcoat layers described in Japanese Patent O.P.I. Publication Nos. 2002-019318 and 2002-086948 may also be preferably employed.

The coating amount of a protective layer is 0.01-10 g/$m^2$, preferably 0.1-3 g/$m^2$, and more preferably 0.2-2 g/$m^2$.

An imagewise heating process in the image forming method of the present invention is preferably conducted via image exposure employing a laser, but it is particularly preferable that images are formed via image exposure employing an infrared laser.

The image exposure is preferably scanning exposure, which is carried out employing a laser which can emit light having a wavelength of infrared and/or near-infrared regions, that is, a wavelength of 700-1500 nm.

As the laser, a gas laser can be used, but a semi-conductor laser, which emits light having a near-infrared region wavelength, is preferably used.

A device suitable for the scanning exposure may be any device capable of forming an image on the printing plate material surface according to image signals from a computer employing the semi-conductor laser, but particularly, following process (3) is preferably employed.

Generally, the following scanning exposure processes are provided.

(1) A process in which a plate precursor provided on a fixed horizontal plate is scanning exposed in two dimensions, employing one or several laser beams.

(2) A process in which the surface of a plate precursor provided along the inner peripheral wall of a fixed cylinder is subjected to scanning exposure in the rotational direction (in the main scanning direction) of the cylinder, employing one or several lasers located inside the cylinder, moving the lasers in the normal direction (in the sub-scanning direction) to the rotational direction of the cylinder.

(3) A process in which the surface of a plate precursor provided along the outer peripheral wall of a fixed cylinder is subjected to scanning exposure in the rotational direction (in the main scanning direction) of the cylinder, employing one or several lasers located inside the cylinder, moving the lasers in the normal direction (in the sub-scanning direction) to the rotational direction of the cylinder.

The plate making and printing are preferably carried out employing a printing press equipped with an exposure device provided on the press in the case of above process (3).

(Printing Development-on-Press)

The development-on-press in the process of preparing a planographic printing plate to conduct a developing treatment on a printing press means that removal on a press of the image formation layer at unexposed portions is carried out. A dampening roller and an inking roller are also brought into contact with the image formation layer while rotating the plate cylinder, to be carried out according to various sequences such as those described below or another appropriate sequence.

The supplied amount of dampening water may be adjusted to be greater or smaller than the amount ordinarily supplied in printing, and the adjustment may be carried out stepwise or continuously.

(1) A dampening roller is brought into contact with the image formation layer of a printing plate material on the plate cylinder during one to several tens of rotations of the plate cylinder, and then an inking roller brought into contact with the image formation layer during the next one to tens of rotations of the plate cylinder. Thereafter, printing is carried out.

(2) An inking roller is brought into contact with the image formation layer of a printing plate material on the plate cylinder during one to several tens of rotations of the plate cylinder, and then a dampening roller brought into contact with the image formation layer during the next one to tens of rotations of the plate cylinder. Thereafter, printing is carried out.

(3) An inking roller and a dampening roller are brought into contact with the image formation layer of a printing plate material on the plate cylinder during one to several tens of rotations of the plate cylinder. Thereafter, printing is carried out.

(Printing Press)

In the present invention, a commonly known printing press equipped with a member to supply the printing plate surface with dampening water as well as a member to supply the printing plate surface with ink can be employed as a printing press.

Though either an infeed-supply type dampener or a continuous supply type dampener can be employed to supply the printing plate surface with dampening water, the continuous supply type dampener is preferably used.

(Printing Ink)

Ink used for printing of the present invention may be any ink, as long as the ink is usable for planographic printing. Specific examples of the ink include oil based ink composed of components such as a rosin modified phenol resin, vegetable oil (flaxseed oil, wood oil, soybean oil and such), a petroleum solvent, pigment, and an oxidative polymerization catalyst (cobalt, manganese, lead, iron, zinc, and such); UV curable type ink composed of an acryloligomer, an acrylmonomer, a photopolymerization initiator and pigment; and further hybrid ink combining properties of oil based ink and UV ink.

(Ink Cleaning Agent)

An ink cleaning agent is employed to dissolve printing ink used during printing, and to remove printing ink adhering to image portions of a planographic printing plate. In the present invention, a commonly usable ink cleaning agent containing a petroleum solvent as an ink-dissolving component. Not only the above-described printing ink is removed, but also colorants on the hydrophilic surface exposed via removal of the thermosensitive image formation layer are further removed at the same time.

(Dampening Water)

Conventionally usable dampening water such as tap water, well water or such can be employed for printing a planographic printing plate. A phosphoric acid or its salt, a citric acid or its salt, a nitric acid or its salt, and an acetic acid or its salt, for example, may be contained in the dampening water. Specifically contained may be acids such as a phosphoric acid, an ammonium phosphoric acid, a sodium phosphoric acid, a citric acid, an ammonium citric acid, a sodium citric acid, an acetic acid, an ammonium acetic acid and a sodium acetic acid; water-soluble polymer compounds such as carboxy methyl cellulose and carboxy ethyl cellulose; solvents such as alcohol and multivalent alcohol; or surfactants such as an anionic surfactant, a cationic surfactant, an amphoteric surfactant and a nonionic surfactant. It is preferable that the content is 0.05-0.1% by weight, based on the total amount.

EXAMPLE

Next, the present invention will now be described in detail referring to examples, however, the present invention is not limited thereto. Incidentally, "part" in the description represents "part by weight", unless otherwise mentioned.

Plate-Making Method 1

[Preparation of Support]

A 0.24 mm thick aluminum plate (material 1050, refining H16) was immersed in an aqueous 1% by weight sodium hydroxide solution at 50° C. so as to give an aluminum dissolution amount of 2 g $m^2$ via dissolution treatment, washed with water, immersed in an aqueous 0.1% by weight hydrochloric acid solution at 25° C. for 30 seconds to neutralize, and then washed with water.

Subsequently, the aluminum plate was subjected to an electrolytic surface-roughening treatment in an electrolytic solution containing 10 g/liter of hydrochloric acid and 0.5 g/liter of aluminum at a peak current density of 50 A/$dm^2$ employing an alternating current with a sine waveform.

The distance between the plate surface and the electrode was 10 mm in this case. The electrolytic surface-roughening treatment was divided into 12 processes, in which the quantity of electricity used in one process (at a positive polarity) was 40 C/$dm^2$, and the total quantity of electricity used (at a positive polarity) was 480 C/$dm^2$. Standby time of 5 seconds, during which no surface-roughening treatment was carried out, was provided after each of the processes of electrolytic surface-roughening treatment.

Subsequently, the resulting aluminum plate was immersed in an aqueous 1% by weight sodium hydroxide solution at 50° C. and etched to give an aluminum etching amount (including smut produced on the surface) of 1.2 g/$m^2$, washed with water, neutralized in an aqueous 10% by weight sulfuric acid solution at 25° C. for 10 seconds, and washed with water.

Subsequently, the aluminum plate was subjected to anodizing treatment in an aqueous 20% by weight sulfuric acid solution at a constant voltage of 20 V, in which a quantity of electricity of 150 C/$dm^2$ was supplied, and washed with water.

The washed surface of the plate was squeegeed, and the plate was immersed in an aqueous 1% by weight sodium dihydrogen phosphate solution at 70° C. for 30 seconds, washed with water, and dried at 80° C. for 5 minutes to obtain an aluminum support.

The aluminum support has 460 nm in Ra (measured in magnification at a factor of 40, employing RST Plus, produced by WYKO Corporation).

Next, the aluminum support was immersed in an aqueous 0.1% by weight carboxymethyl cellulose solution 1150 (produced by Daicel Kagaku Co., Ltd.) at 75° C. for 30 seconds while stirring, then washed with water, and dried to obtain support 1.

[Coloring of Hydrophilic Surface]

A coating amount was adjusted to coat an aqueous 5% by weight Food Blue No. 1 Brilliant Blue FCF solution in such a way that the cyan content increased by an amount of 0.5% by weight after drying.

As for measuring density difference of the hydrophilic surface, the reflection density difference of cyan (C) was determined by using the values measured under the filter condition of D65, accompanied with a field of view of 2° and density standard of Status-T, employing a spectrodensitometer Spectrolino, produced by GretagMacbeth Ltd.

[Measurement of Colorant Solubility]

Solubility was confirmed under the following conditions via dissolution in water or flushing oil.

Solubility with Respect to n-Decane

A colorant was added into 1 liter of n-decane in a glass container temperature-adjusted at 25° C. while stirring for 30 minutes by a magnetic stirrer, and solubility was determined to be obtained at the time when no insoluble remained.

Solubility with Respect to Water

Similarly to the above, a colorant was added into 1 liter of water, and solubility was determined to be obtained.

Solubility concerning the employed colorant is shown in Table 1.

[Coating of Image Formation Layer]

After mixing materials having the following compositions while stirring sufficiently, the resulting was diluted with pure water, and filtrated to prepare a coating solution for image formation layer (1) of 2.5% by weight in solid content.

Thereafter, the coating solution for image formation layer (1) was coated onto above-described support 1 employing a wire bar to give a thickness of 0.4 g/$m^2$ via adjustment of a coating amount after drying, and dried at 50° C. for 3 minutes.

Printing Plate Material 1

Aging treatment was subsequently conducted at 40° C. for 24 hours to obtain printing plate material 1. The ratio of parts by weight represents a ratio of weight in solid content after drying.

Coating Solution Composition for Image Formation Layer (1)

| | |
|---|---|
| Water-dispersible block type polyurethane prepolymer solution (Takenate, produced by Mitsui Takeda Chemical Co., Ltd. solid content: 44% by weight) | 155 parts |
| Water-soluble resin: aqueous solution of sodium polyacrylate Aqualic DL522, produced by Nippon Shokubai Co., Ltd. (solid content: 10% by weight) | 40 parts |
| Infrared absorbing dye: 2% by weight isopropanol solution of ADS830AT (produced by AmericanDyeSource, Inc.) | 800 parts |
| Layered mineral particles: 5% hydrophilic Smectite SWN aqueous solution, produced by Co-op Chemical Co., Ltd. | 400 parts |

[Image Formation Via Infrared Laser Exposure]

Printing plate material 1 was wound around an exposure drum, and fixed. Images were formed at a resolving degree of 2400 dpi ("dpi" means a dot number per 1 inch, i.e., 2.54 cm) and at a screen number of 175 with 400 mJ/cm$^2$ in exposure energy, employing a 830 nm wave length laser with a spot diameter of 18 μm during exposure. The image pattern used for the exposure comprises a solid image and a dot image with a dot area of 1 to 99%.

[Printing Method]

Printing was carried out employing a printing press, DAIYA 1F-1 produced by Mitsubishi Jukogyo Co., Ltd., accompanied with coated paper, a dampening solution, a 2% by weight solution of Astromark 3 (produced by Nikken Kagaku Kenkyusyo Co., Ltd.) and printing ink (Toyo King Hyunity Magenta, produced by Toyo Ink Manufacturing Co. Ltd.). The printing plate material was mounted on a plate cylinder of a printing press after exposure, and printing was conducted in the same initial printing sequence as in a conventional PS plate. Density at solid image portions of a printed paper sheet was adjusted to 1.4 (The same measuring condition of density as aforementioned).

Cleaning of Printing Plate after Printing

After printing free from ink supply roller pressure was continuously conducted, and no transfer of ink onto a printing paper sheet was confirmed, the printing operation was stopped to remove the printing plate from the printing press.

The printing surface of a printing plate was wiped off until complete removal of printing ink, employing a cellulose sponge in which a printing cleaner "Print Cleaner" (produced by Toyo Ink Mfg. Co., Ltd.) was permeated.

[Evaluation of Visualization]

(1) Exposure Visualization Property

After image formation via infrared laser exposure, a printing plate material was observed under a light source of a calibrated light source apparatus Prooflite LD50-440 (for reflection), produced by GregMacbeth Ltd., to observe images at dot step portions.

Comparison was made, concerning whether the tonal difference of different dot % step-to-dot % step in this case was distinguishable or not.

Evaluation Criteria

5: 10% step of dot tonal difference in a dot area of 5-95% is visually distinguishable.

4: 20% step of dot tonal difference in a dot area of 10-90% is visually distinguishable.

3: Dot tonal differences in steps of a dot area of 0% (non-exposure portion), a dot area of 50%, and a dot area of 100% (solid exposure portion) are visually distinguishable.

2: Dot tonal difference in a step of a dot area of 0% (non-exposure portion) and a dot area of 100% (solid exposure portion) is visually distinguishable.

1: Dot tonal difference between a non-exposure portion and a solid exposure portion is indistinguishable.

[Evaluation of Visualization after Printing]

(2) Exposure Visualization Property

A printing plate was washed after printing, and the printing plate surface after drying was observed under a light source of a calibrated light source apparatus Prooflite LD50-440 (for reflection), produced by GregMacbeth Ltd., to observe images at dot step portions.

Comparison was made, concerning whether the tonal difference of different dot % step-to-dot % step in this case was distinguishable or not.

Evaluation Criteria

5: 5% step of dot tonal difference in a dot area of 5-95% is visually distinguishable.

4: 10% step of dot tonal difference in a dot area of 10-90% is visually distinguishable.

3: 20% step of dot tonal difference in a dot area of 50-100% (solid exposure portion), as well as difference of a dot area of 0% (non-exposure portion) is visually distinguishable.

2: Dot tonal difference in a step of a dot area of 0% (non-exposure portion) and a dot area of 100% (solid exposure portion) is visually distinguishable.

1: Dot tonal difference between a non-exposure portion and a solid exposure portion is indistinguishable.

[Evaluation of on-Press Developability]

Observation from the first paper sheet was made immediately after printing started, and the number of printed paper sheets printed until when no color of the transferred colorant at non-image portions of a printing paper sheet is visually confirmed was counted, to evaluate an anti-stain property. The above number of printed paper sheets is designated as a measure of on-press developability.

5: No occurrence from the first paper sheet.

4: Less than 10 paper sheets.

3: at least 10 and less than 20 paper sheets.

2: at least 20 and less than 50 paper sheets.

1: at least 50 paper sheets.

Printing Plate Material 2

Printing plate material 2 was prepared similarly to preparation of foregoing printing plate material 1, except that a colorant was replaced by the following colorant in the process of coloring the hydrophilic surface of printing plate material 1.

Colorant: 0.2% by weight methylethylketone dispersible solution of Food blue No. 1 Aluminum Lake (produced by Kiriya Chemical Co., Ltd.)

Printing Plate Material 3

Printing plate material 3 was prepared similarly to preparation of printing plate material 1, except that a colorant was replaced by the following colorant in the process of coloring the hydrophilic surface of printing plate material 1.

1.0% by weight water-soluble solution of Food blue No. 2 Indigo Carmine (produced by Kiriya Chemical Co., Ltd.)

Printing Plate Material 4

Printing plate material 4 was prepared similarly to preparation of printing plate material 1, except that a colorant was replaced by the following colorant in the process of coloring the hydrophilic surface of printing plate material 1.

5.0% by weight methylethylketone solution of phthalocyanine blue dye EXCOLOR 609K (produced by Nippon Shokubai Co., Ltd.)

Printing Plate Material 5

Printing plate material 5 was prepared similarly to preparation of printing plate material 1, except that the process of coloring the hydrophilic surface was skipped in the process of preparing printing plate material 1.

Printing Plate Material 6

Printing plate material 6 was prepared similarly to preparation of printing plate material 1, except that a colorant was replaced by the following colorant in the process of coloring the hydrophilic surface of printing plate material 1.

5.0% by weight methylethylketone solution of Kayaset Blue 714 (produced by Nippon Kayaku Co., Ltd.)

Results are shown in Table 1. As is clear from Table 1, it is to be understood that the planographic printing plate material of the present invention exhibits not only an excellent exposure visualization property as well as an excellent printing visualization property, but also an excellent on-press developability, accompanied with an anti-stain property.

What is claimed is:

1. An image forming method comprising the steps of:

(a) conducting a development treatment of exposing a hydrophilic surface of an aluminum support by removing a thermosensitive image formation layer provided on the hydrophilic surface, that is not imagewise heated on a printing press to produce a planographic printing plate, after imagewise heating a planographic printing plate material having the thermosensitive image formation layer provided on the hydrophilic surface of the aluminum support;

(b) applying ink to the planographic printing plate to conduct printing employing the inked planographic printing plate; and (c) treating the planographic printing plate with an ink cleaning agent after printing to remove the ink;

wherein the hydrophilic surface is colored by a colorant having a solubility of 5-100 g, based on 1 liter of n-decane, and not only the ink is removed, but also the colorant on the hydrophilic surface exposed via removal of the thermosensitive image formation layer is further removed at the same time in step (c).

2. The planographic printing plate material employed in the image forming method of claim 1, wherein the thermosensitive image formation layer is provided on the hydrophilic surface of the aluminum support, and the hydrophilic surface is colored by a colorant having a solubility of 5-100 g, based on 1 liter of n-decane.

TABLE 1

| *1 | Colorant on the hydrophilic surface | Solubility: n-decane (g/L) | Solubility: Water (g/L) | Exposure visualization property | Visualization property after printing | *2 | Remarks |
|---|---|---|---|---|---|---|---|
| 1 | Provided | At most 1 g | 180 g | 3 | 1 | 1 | Comparative example |
| 2 | Provided | Less than 0.5 g | Less than 0.5 g | 2 | 1 | 4 | Comparative example |
| 3 | Provided | 5 g | 10 g | 4 | 4 | 4 | Present invention |
| 4 | Provided | 100 g | Less than 0.5 g | 5 | 5 | 5 | Present invention |
| 5 | Not provided | — | — | 1 | 1 | 5 | Comparative example |
| 6 | Provided | At least 101 g | Less than 0.5 g | 4 | 1 | 2 | Comparative example |

*1: Printing plate material No.
*2: On-press developability

[Effect of the Invention]

According to the foregoing structures of the present invention, a planographic printing plate material and an image forming method exhibiting excellent printing visualization property and anti-stain property can be provided. Specifically provided can be the planographic printing plate material and the image forming method exhibiting not only an excellent exposure visualization property as well as an excellent printing visualization property, but also an excellent on-press developability, accompanied with and anti-stain property.

3. The planographic printing plate material of claim 2, wherein the thermosensitive image formation layer contains a water-soluble resin or a water-dispersible resin.

4. The planographic printing plate material of claim 2, wherein the colorant has a solubility of 0-0.5 g, based on 1 liter of water at 25° C.

5. The planographic printing plate material of claim 3, wherein the colorant has a solubility of 0-0.5 g, based on 1 liter of water at 25° C.

6. The planographic printing plate material of claim 2, wherein the thermosensitive image formation layer is an image formation layer capable of varying transparency via imagewise heating.

7. The planographic printing plate material of claim 3, wherein the thermosensitive image formation layer is an image formation layer capable of varying transparency via imagewise heating.

8. The planographic printing plate material of claim 4, wherein the thermosensitive image formation layer is an image formation layer capable of varying transparency via imagewise heating.

* * * * *